(12) United States Patent
Holden et al.

(10) Patent No.: US 9,299,614 B2
(45) Date of Patent: Mar. 29, 2016

(54) METHOD AND CARRIER FOR DICING A WAFER

(71) Applicants: James M. Holden, San Jose, CA (US); Brad Eaton, Menlo Park, CA (US); Aparna Iyer, Sunnyvale, CA (US); Ajay Kumar, Cupertino, CA (US)

(72) Inventors: James M. Holden, San Jose, CA (US); Brad Eaton, Menlo Park, CA (US); Aparna Iyer, Sunnyvale, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/538,126

(22) Filed: Nov. 11, 2014

(65) Prior Publication Data
US 2015/0162244 A1      Jun. 11, 2015

Related U.S. Application Data

(60) Provisional application No. 61/914,323, filed on Dec. 10, 2013.

(51) Int. Cl.
| | |
|---|---|
| *H01L 21/78* | (2006.01) |
| *H01L 21/3065* | (2006.01) |
| *H01L 21/308* | (2006.01) |
| *H01L 21/66* | (2006.01) |
| *B23Q 3/18* | (2006.01) |
| *H01L 21/304* | (2006.01) |
| *H01L 21/683* | (2006.01) |
| *H01L 21/67* | (2006.01) |

(52) U.S. Cl.
CPC *H01L 21/78* (2013.01); *B23Q 3/18* (2013.01); *H01L 21/308* (2013.01); *H01L 21/3043* (2013.01); *H01L 21/3065* (2013.01); *H01L 21/67207* (2013.01); *H01L 21/6836* (2013.01); *H01L 22/26* (2013.01); *H01L 2221/68327* (2013.01); *H01L 2221/68377* (2013.01)

(58) Field of Classification Search
None
See application file for complete search history.

(56) References Cited

U.S. PATENT DOCUMENTS

| | | | |
|---|---|---|---|
| 4,049,944 | A | 9/1977 | Garvin et al. |
| 4,339,528 | A | 7/1982 | Goldman |
| 4,684,437 | A | 8/1987 | Donelon et al. |
| 5,336,638 | A | 8/1994 | Suzuki et al. |
| 5,593,606 | A | 1/1997 | Owen et al. |
| 5,691,794 | A | 11/1997 | Hoshi et al. |

(Continued)

FOREIGN PATENT DOCUMENTS

| | | |
|---|---|---|
| JP | 9216085 | 8/1997 |
| JP | 10321908 | 12/1998 |

(Continued)

OTHER PUBLICATIONS

Linder, V. et al., "Water-Soluble Sacrificial Layers for Surface Micromachining," www.small-journal.com, 2005, 1, No. 7, 7 pgs.

(Continued)

*Primary Examiner* — Jiong-Ping Lu
(74) *Attorney, Agent, or Firm* — Blakely Sokoloff Taylor Zafman LLP

(57) ABSTRACT

Methods of and carriers for dicing semiconductor wafers, each wafer having a plurality of integrated circuits, are described. In an example, a carrier for supporting a wafer or substrate in an etch process includes a frame having a perimeter surrounding an inner opening. The carrier also includes a tape coupled to the frame and disposed below the inner opening of the frame, the tape comprising an etch stop layer disposed above a support layer.

9 Claims, 8 Drawing Sheets

(56) References Cited

U.S. PATENT DOCUMENTS

| | | | |
|---|---|---|---|
| 6,051,503 A | 4/2000 | Bhardwaj et al. | |
| 6,057,180 A | 5/2000 | Sun et al. | |
| 6,174,271 B1 | 1/2001 | Kosmowski | |
| 6,300,593 B1 | 10/2001 | Powell | |
| 6,306,731 B1 | 10/2001 | Igarashi et al. | |
| 6,407,363 B2 | 6/2002 | Dunsky et al. | |
| 6,426,275 B1 | 7/2002 | Arisa | |
| 6,465,158 B1 | 10/2002 | Sekiya | |
| 6,528,864 B1 | 3/2003 | Arai | |
| 6,574,250 B2 | 6/2003 | Sun et al. | |
| 6,582,983 B1 | 6/2003 | Runyon et al. | |
| 6,593,542 B2 | 7/2003 | Baird et al. | |
| 6,642,127 B2 | 11/2003 | Kumar et al. | |
| 6,676,878 B2 | 1/2004 | O'Brien et al. | |
| 6,696,669 B2 | 2/2004 | Hembree et al. | |
| 6,706,998 B2 | 3/2004 | Cutler | |
| 6,759,275 B1 | 7/2004 | Lee et al. | |
| 6,803,247 B2 | 10/2004 | Sekiya | |
| 6,887,804 B2 | 5/2005 | Sun et al. | |
| 6,982,175 B2 * | 1/2006 | Johnson et al. | 438/9 |
| 6,998,571 B2 | 2/2006 | Sekiya et al. | |
| 7,128,806 B2 | 10/2006 | Nguyen et al. | |
| 7,129,150 B2 | 10/2006 | Kawai | |
| 7,179,723 B2 | 2/2007 | Genda et al. | |
| 7,265,033 B2 | 9/2007 | Shigematsu et al. | |
| 7,361,990 B2 | 4/2008 | Lu et al. | |
| 7,364,986 B2 | 4/2008 | Nagai et al. | |
| 7,435,607 B2 | 10/2008 | Nagai | |
| 7,459,377 B2 | 12/2008 | Ueda et al. | |
| 7,468,309 B2 | 12/2008 | Shigematsu et al. | |
| 7,473,866 B2 | 1/2009 | Morishige et al. | |
| 7,507,638 B2 | 3/2009 | Mancini et al. | |
| 7,507,639 B2 | 3/2009 | Nakamura | |
| 7,629,228 B2 | 12/2009 | Haji et al. | |
| 7,678,670 B2 | 3/2010 | Arita et al. | |
| 7,687,740 B2 | 3/2010 | Bruland et al. | |
| 7,754,584 B2 | 7/2010 | Kumakawa | |
| 7,767,551 B2 | 8/2010 | Arita et al. | |
| 7,767,554 B2 | 8/2010 | Arita et al. | |
| 7,776,720 B2 | 8/2010 | Boyle et al. | |
| 7,804,043 B2 | 9/2010 | Deshi | |
| 7,838,323 B2 | 11/2010 | Utsumi et al. | |
| 7,859,084 B2 | 12/2010 | Utsumi et al. | |
| 7,875,898 B2 | 1/2011 | Maeda | |
| 7,906,410 B2 * | 3/2011 | Arita et al. | 438/462 |
| 7,923,351 B2 | 4/2011 | Arita | |
| 7,926,410 B2 | 4/2011 | Bair | |
| 7,927,973 B2 | 4/2011 | Haji et al. | |
| 2003/0077878 A1 | 4/2003 | Kumar et al. | |
| 2003/0162313 A1 | 8/2003 | Kim et al. | |
| 2004/0080045 A1 | 4/2004 | Kimura et al. | |
| 2004/0080050 A1 | 4/2004 | McMillin et al. | |
| 2004/0137700 A1 | 7/2004 | Sekiya | |
| 2004/0157457 A1 | 8/2004 | Xu et al. | |
| 2004/0212047 A1 | 10/2004 | Joshi et al. | |
| 2006/0043535 A1 | 3/2006 | Hiatt | |
| 2006/0086898 A1 | 4/2006 | Cheng et al. | |
| 2006/0088984 A1 | 4/2006 | Li et al. | |
| 2006/0146910 A1 | 7/2006 | Koochesfahani et al. | |
| 2006/0205182 A1 | 9/2006 | Soejima | |
| 2009/0255911 A1 | 10/2009 | Krishnaswami et al. | |
| 2010/0013036 A1 | 1/2010 | Carey | |
| 2010/0216313 A1 | 8/2010 | Iwai et al. | |
| 2010/0248451 A1 | 9/2010 | Pirogovsky et al. | |
| 2010/0279491 A1 | 11/2010 | Kiuchi et al. | |
| 2011/0014777 A1 | 1/2011 | Haji et al. | |
| 2011/0312157 A1 | 12/2011 | Lei et al. | |
| 2013/0045554 A1 | 2/2013 | Yamazaki | |
| 2013/0065378 A1 | 3/2013 | Johnson et al. | |
| 2013/0230972 A1 | 9/2013 | Johnson et al. | |
| 2013/0230974 A1 | 9/2013 | Martinez et al. | |
| 2013/0280890 A1 | 10/2013 | Lei et al. | |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| JP | 2004-193305 | 7/2004 |
| WO | WO-03036712 | 5/2003 |
| WO | WO-03071591 | 5/2003 |

OTHER PUBLICATIONS

Singh, Saravjeet et al., "Apparatus and Methods for Dry Etch With Edge, Side and Back Protection," U.S. Appl. No. 61/491,693, filed May 31, 2011 24 pgs.

International Search Report and Written Opinion from PCT/US2014/067761 mailed Feb. 27, 2015, 11 pgs.

* cited by examiner

METHOD AND CARRIER FOR DICING A WAFER

CROSS-REFERENCE TO RELATED APPLICATIONS

This application claims the benefit of U.S. Provisional Application No. 61/914,323, filed on Dec. 10, 2013, the entire contents of which are hereby incorporated by reference herein.

BACKGROUND

1) Field

Embodiments of the present invention pertain to the field of semiconductor processing and, in particular, to methods of and carriers for dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present invention include methods of and carriers for dicing semiconductor wafers.

In an embodiment, a carrier for supporting a wafer or substrate in an etch process includes a frame having a perimeter surrounding an inner opening. The carrier also includes a tape coupled to the frame and disposed below the inner opening of the frame. The tape includes an etch stop layer disposed above a support layer.

In another embodiment, A carrier for supporting a wafer or substrate in an etch process includes a frame having a perimeter surrounding an inner opening. The carrier also includes a tape coupled to the frame and disposed below the inner opening of the frame. The tape includes a layer having an etch stop characteristic.

In another embodiment, a method of dicing a wafer or substrate supported by a carrier involves etching the wafer or substrate by a plasma process. The method also involves detecting a change in etch by-products upon etching through the wafer or substrate and exposing of the carrier.

DETAILED DESCRIPTION

Figure 1:
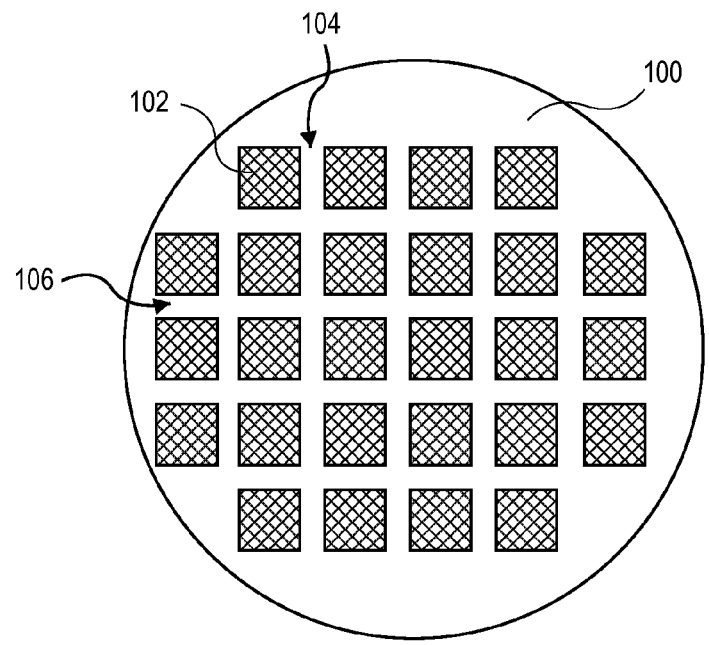
FIG. 1 illustrates a top plan of a semiconductor wafer to be diced, in accordance with an embodiment of the present invention.

Methods of and carriers for dicing semiconductor wafers, each wafer having a plurality of integrated circuits thereon, are described. In the following description, numerous specific details are set forth, such as substrate carriers for thin wafers, scribing and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to wafer dicing by (1) masking a wafer with an appropriate masking material or materials, (2) the mask being patterned at masking or subsequent to masking, the pattern being such that street areas between devices to be diced from the wafer are exposed and the areas of the wafer including the devices are protected by the mask, (3) the wafer being attached and supported by a carrier, (4) the carrier including components of at least one of a dicing tape membrane, die-attach film, adhesives, etch stopping layers, and a supporting structure such as a frame made of metal or plastic or other suitable material, (5) etching the wafer by at least one of, a laser, a plasma etch, a plasma deposition, such that trenches are etched completely around the devices, and the devices being completely separated from the wafer and neighboring devices. The etching process etching through the wafer but stopping essentially at the interface of the carrier and wafer, or etching into the carrier but not through the carrier in such a way as to substantially reduce the structural integrity of the carrier.

In one aspect, a hybrid wafer or substrate dicing process involving an initial laser scribe and subsequent plasma etch may be implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing. In an embodiment, the wafer or substrate is supported by a substrate carrier during the singulation process, including during the etch portion of the singulation process.

To provide context, conventional wafer dicing approaches include diamond saw cutting based on a purely mechanical separation, initial laser scribing and subsequent diamond saw dicing, or nanosecond or picosecond laser dicing. For thin wafer or substrate singulation, such as 50 microns thick bulk silicon singulation, the conventional approaches have yielded only poor process quality. Some of the challenges that may be faced when singulating die from thin wafers or substrates may include microcrack formation or delamination between different layers, chipping of inorganic dielectric layers, retention of strict kerf width control, or precise ablation depth control. Embodiments of the present invention include a hybrid laser scribing and plasma etching die singulation approach that may be useful for overcoming one or more of the above challenges.

In accordance with an embodiment of the present invention, a combination of laser scribing and plasma etching is used to dice a semiconductor wafer into individualized or singulated integrated circuits. In one embodiment, femtosecond-based laser scribing is used as an essentially, if not totally, non-thermal process. For example, the femtosecond-based laser scribing may be localized with no or negligible heat damage zone. In an embodiment, approaches herein are used to singulated integrated circuits having ultra-low k films. With convention dicing, saws may need to be slowed down to accommodate such low k films. Furthermore, semiconductor wafers are now often thinned prior to dicing. As such, in an embodiment, a combination of mask patterning and partial wafer scribing with a femtosecond-based laser, followed by a plasma etch process, is now practical. In one embodiment, direct writing with laser can eliminate need for a lithography patterning operation of a photo-resist layer and can be implemented with very little cost. In one embodiment, through-via type silicon etching is used to complete the dicing process in a plasma etching environment.

Figure 2:
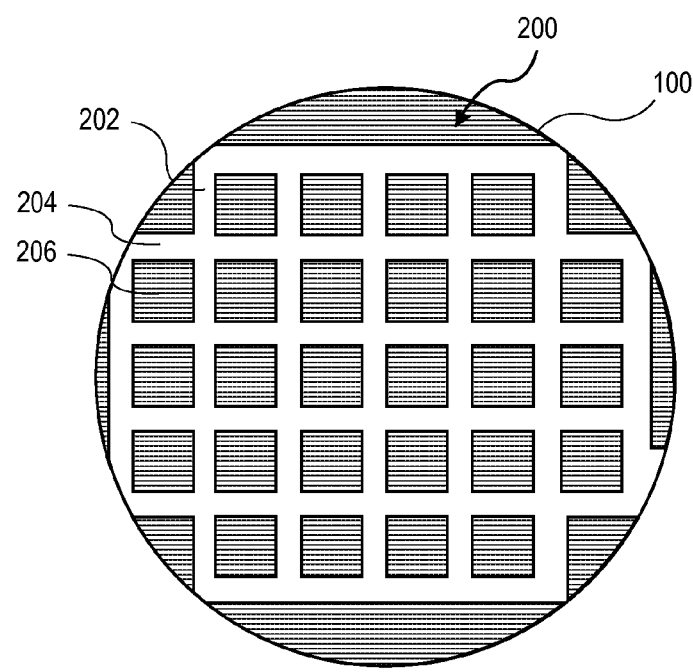
FIG. 2 illustrates a top plan of a semiconductor wafer to be diced that has a dicing mask formed thereon, in accordance with an embodiment of the present invention.

Thus, in an aspect of the present invention, a combination of laser scribing and plasma etching may be used to dice a semiconductor wafer into singulated integrated circuits. FIG. 1 illustrates a top plan of a semiconductor wafer to be diced, in accordance with an embodiment of the present invention. FIG. 2 illustrates a top plan of a semiconductor wafer to be diced that has a dicing mask formed thereon, in accordance with an embodiment of the present invention.

Referring to FIG. 1, a semiconductor wafer 100 has a plurality of regions 102 that include integrated circuits. The regions 102 are separated by vertical streets 104 and horizontal streets 106. The streets 104 and 106 are areas of semiconductor wafer that do not contain integrated circuits and are designed as locations along which the wafer will be diced. Some embodiments of the present invention involve the use of a combination laser scribe and plasma etch technique to cut trenches through the semiconductor wafer along the streets such that the dice are separated into individual chips or die. Since both a laser scribe and a plasma etch process are crystal structure orientation independent, the crystal structure of the semiconductor wafer to be diced may be immaterial to achieving a vertical trench through the wafer.

Referring to FIG. 2, the semiconductor wafer 100 has a mask 200 deposited upon the semiconductor wafer 100. In one embodiment, the mask is deposited in a conventional manner to achieve an approximately 4-10 micron thick layer. The mask 200 and a portion of the semiconductor wafer 100 are, in one embodiment, patterned with a laser scribing process to define the locations (e.g., gaps 202 and 204) along the streets 104 and 106 where the semiconductor wafer 100 will be diced. The integrated circuit regions of the semiconductor wafer 100 are covered and protected by the mask 200. The regions 206 of the mask 200 are positioned such that during a subsequent etching process, the integrated circuits are not degraded by the etch process. Horizontal gaps 204 and vertical gaps 202 are formed between the regions 206 to define the areas that will be etched during the etching process to finally dice the semiconductor wafer 100. In accordance with an embodiment of the present invention, the semiconductor wafer 100 is supported by a wafer carrier during one or both of the laser scribing and/or plasma etching processes.

As mentioned briefly above, in an embodiment, a substrate for dicing is supported by a substrate carrier during the plasma etching portion of a die singulation process, e.g., of a hybrid laser ablation and plasma etching singulation scheme. For example, FIG. 3 illustrates a plan view of a substrate carrier suitable for supporting a wafer during a singulation process, in accordance with an embodiment of the present invention.

Figure 3:
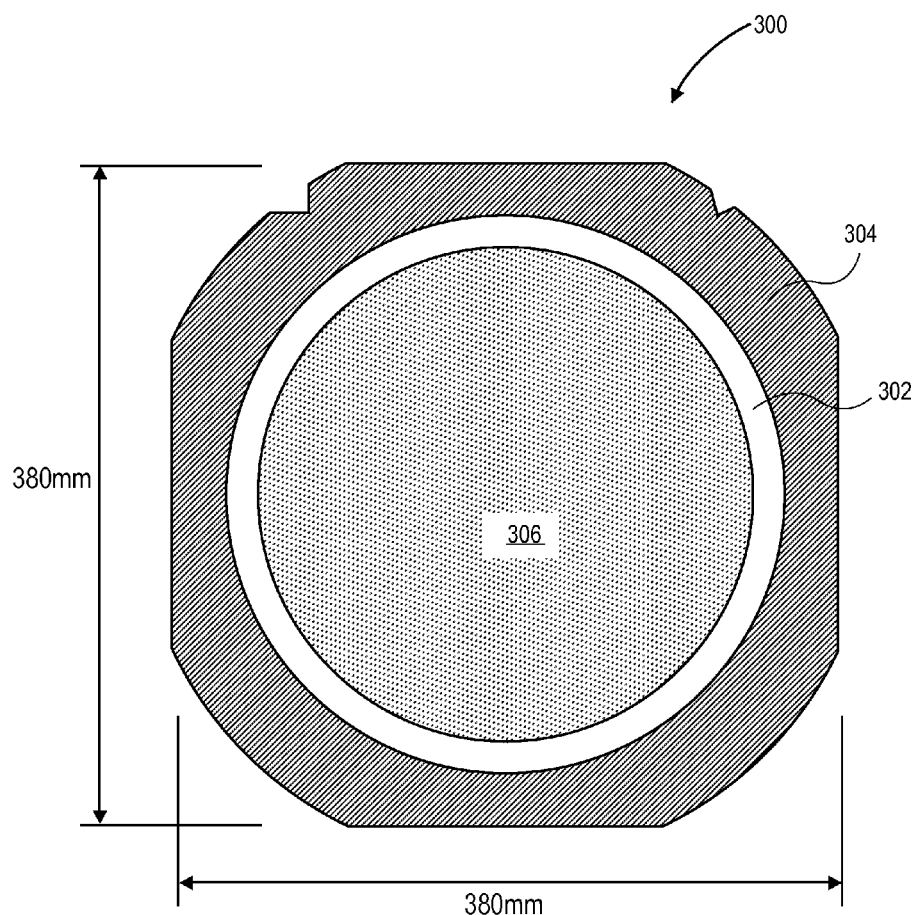
FIG. 3 illustrates a plan view of a substrate carrier suitable for supporting a wafer during a singulation process, in accordance with an embodiment of the present invention.

Referring to FIG. 3, a substrate carrier 300 includes a layer of backing tape 302 surrounded by a tape ring or frame 304. A wafer or substrate 306 is supported by the backing tape 302 of the substrate carrier 300. In one embodiment, the wafer or substrate 306 is attached to the backing tape 302 by a die attach film. In one embodiment, the tape ring 304 is composed of stainless steel.

In an embodiment, a singulation process can be accommodated in a system sized to receive a substrate carrier such as the substrate carrier 300. In one such embodiment, a system such as system 800, described in greater detail below in association with FIG. 8, can accommodate a wafer frame without impact on the system footprint that is otherwise sized to accommodate a substrate or wafer not supported by a substrate carrier. In one embodiment, such a processing system is sized to accommodate 300 millimeter-in-diameter wafers or substrates. The same system can accommodate a wafer carrier approximately 380 millimeters in width by 380 millimeters in length, as depicted in FIG. 3. However, it is to be appreciated that systems may be designed to handle 450 millimeter wafers or substrate or, more particularly, 450 millimeter wafer or substrate carriers.

In an embodiment, providing further context, a wafer such as a silicon or gallium arsenide wafer used in the production of integrated circuit devices called "chips" is diced by an etching process that might include plasma etching using, e.g., ion bombardment or reactive species and laser etching, e.g., thermal ablation or non-thermal ablation while the devices are protected by a masking material such as a water soluble poly vinyl alcohol (PVA), non-water soluble materials such as photoresist, or dielectric materials such as silicon dioxide. The etch process is specifically performed to (1) completely etch through the wafer to singulate the devices, while (2) not etching through the carrier in any way that could compromise the structural integrity of the carrier enough to prevent it from accomplishing its purpose of supporting the wafer to and from the etch process and allowing singulated devices to be picked from the carrier without damage to individual devices.

Figure 4:
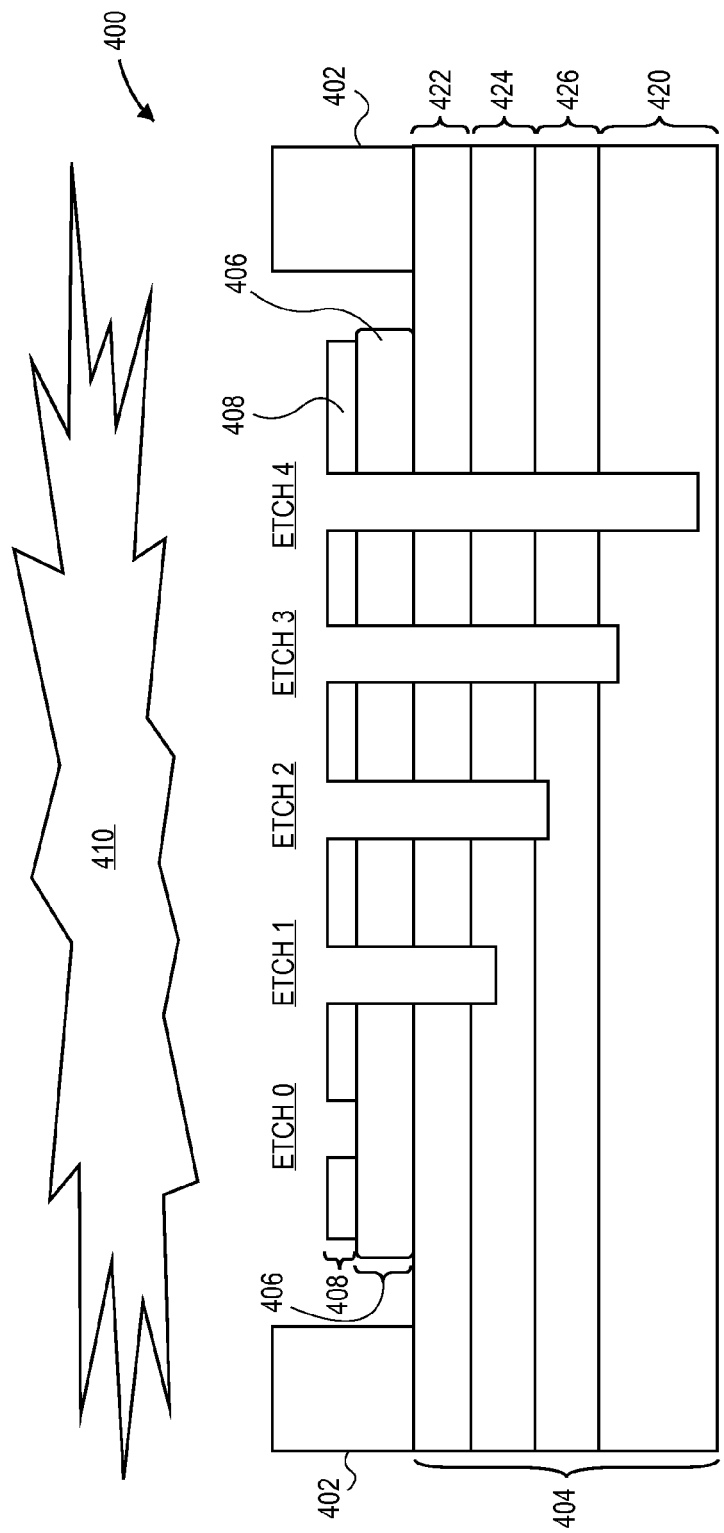
FIG. 4 illustrates a cross-sectional view of a wafer and carrier, in accordance with an embodiment of the present invention.

FIG. 4 illustrates a cross-sectional view of a wafer and carrier, in accordance with an embodiment of the present invention.

Referring to FIG. 4, a substrate carrier 400 includes a frame 402 and underlying dicing tape 404. The carrier 400 is sized to accommodate a wafer or substrate 406 within the frame 402, on the underlying tape 404. A mask layer 408 may be included on the wafer or substrate 406. The pairing of the carrier 400 and substrate 406 may be suitable for exposure to and etch plasma 410.

Referring again to FIG. 4, the carrier 400 includes a support layer 420. The carrier 400 may also include one or more of (1) an optional die-attach film (DAF) 422, (2) an optional adhesive 424, and/or (3) an optional dedicated etch stop layer 426. The collection of the up to four layer types 420/426/424/422 as part of the carrier 400 is referred to as dicing tape 404.

In an embodiment, in the case that a DAF layer 422 is included, the DAF layer 422 is a layer generally in contact with the wafer 406 that, when present, becomes a part of the singulated devices. In an embodiment, in the case that an adhesive 424 is included, the adhesive layer 424 may be different from or an adhesive layer component of the DAF 422, and can used to adhere the wafer 406 and the resulting singulated devices to the carrier 400 before and after the etch, respectively. Furthermore, the adhesive layer 424, if included, may be a release adhesive that may release when exposed to, e.g. UV light or elevated temperature. In an embodiment, the support layer 420 is a flexible, stretchable membrane.

In accordance with an embodiment of the present invention, four exemplary etch processes are depicted in FIG. 4, "Etch 0", "Etch 1", "Etch 2", and "Etch 3". Etch 0, as shown, has progressed through the top of the wafer 406 (and, if present, the mask layer 408), and may have been accomplished by laser etching as described, and this is particularly useful for when a subsequent etch process is unable to etch through layers on top of the wafer, such as device and test structures which may contain dielectric and metals such as copper. Etch 0 may be considered a part of the patterning process and may have been accomplished by a laser etch operation. Alternatively, the patterning may be a separate operation which patterns only the mask 408, such as in a photo resist deposition, exposure, and develop process commonly employed in integrated circuit production, or intrinsically a part of the film such as in a silk screening process.

"Etch 1", as shown, has progressed through the wafer 406 and optional DAF 422 and has stopped in the optional adhesive layer 424. In this case, the optional adhesive layer 424 is acting as an etch stop layer. "Etch 2", as shown, has progressed through the wafer 406, the optional DAF 422, the optional adhesive layer 424, and has stopped in the optional etch stop layer 426. In this case, the optional etch stop layer 426 is acting as an etch stop layer. "Etch 3", as shown has progressed through the wafer 406, the optional DAF 422, the optional adhesive layer 424, the optional etch stop layer 426, and had stopped inside the support layer 420 but not so deeply as to substantially compromise the structural integrity of the support layer 420 and its purpose of supporting the wafer and allowing singulated devices to be picked after singulation. "Etch 4", as shown, has progressed through the wafer 406, the optional DAF 422, the optional adhesive 424, the optional etch stop 426, and deeply into the support layer 420 and seriously and substantially compromised the structural integrity of the support layer 420. Etch 4 is an example of an undesirable etch that would result in partial or complete loss of all devices on the wafer as well as potentially fouled etch apparatus, e.g. chuck, vacuum chamber, or the laser chamber.

None, any or all, of the optional adhesive 424, the optional etch stop 426, and the support layer 420 may have etch stopping properties. The etch stopping allows the etch process to be performed sufficiently long to etch completely through the wafer 406 and optional DAF 422 at all points of the wafer 406 so all the devices are singulated from the wafer 406 and from each other, but safely such that the support layer 420 is not etched through or structurally compromised. To be an etch stop, a layer can have at least one of several properties from the list of (1) low etch rate and high resistance to the etch process relative to the wafer in concert with a sufficient thickness, and (2) capable of generating a differentiable signal to an end point sensor, such as an optical emission sensor (OES) end point detection system or a laser end point system.

In accordance with an embodiment of the present invention, the carrier 400 of FIG. 4 includes a dedicated on distinct etch stop layer 426 disposed above a separate support layer 420. A wafer 406 may be attached to the etch stop layer by a DAF 422 and/or an adhesive layer 424, one or both of which may be included with the carrier 400 or may instead be delivered with the wafer to the carrier at the time of attaching to the carrier, providing a modified carrier. In one embodiment, the adhered wafer 406 is a silicon based wafer and the dedicated etch stop layer 426 is a layer of silicon dioxide. In a specific embodiment, the silicon dioxide layer etches approximately 20 times slower than the silicon wafer in an etch used to singulate the silicon wafer (e.g., such as in a fluoride-based plasma etch process). In a particular embodiment, the silicon wafer is approximately 200 microns thick, and an approximately 20 micron silicon dioxide layer is used as a discrete etch stop layer in the carrier. In that embodiment, the etch stop layer 426 thickness is targeted to accommodate etching into about half of the thickness of the etch stop layer in the case of exposure to an overetch. In another embodiment, the etch stop layer 426 is a layer of an organic polymer.

The low etch rate of the functionally etch stopping layer is an etch stopping property because, when the etch process arrives at the etch stopping layer, the material etches slowly. A manageably thin layer, for example 1 to 20 microns, of etch stopping material may take a substantially longer time to etch through than the wafer even though the wafer could be considerably thicker, such as 50 to 500 microns thick. Therefore, while etching the wafer with a non-uniform etch process, for example one with center-to-edge (CTE) non-uniformity in etch rates, or etching through a wafer of non-uniform thickness, the etch process may be run longer, to completely etch through the wafer, and across the entire surface of the wafer, despite the, for example, CTE non-uniformity or the non-uniform thickness wafer.

Alternatively, or additionally, the etch stopping property of the etch stopping layer 426 may be that a differentiable signal is generated upon etching of the etch stopping layer 426 because the etching of the etch stopping layer generates detectable signal in an end pointing apparatus such as an OES. A differentiable signal to an OES, for example, during a plasma etch process is typically a result of different composition of a new layer being etched relative to a previous layer (in this case, a substrate). The new layer may be an organic polymer, resulting in a noticeable emission from the etch plasma that is not ordinarily present until the etch process has cleared through at least some of the intervening wafer, which may be silicon. The different emission is pickup in the spectrograph of the OES instrument and a signal is given to control software to cease the etch process, a step known as "end point". Other end point instrumentation based on light absorption in the reactants, for example, rather than emission, is also possible. In such a sensor, the light source such as a laser beam or a broad band source is directed through the plasma chamber above or in proximity to the wafer or possibly downstream of the chamber, and the absorption of light caused by the plasma reactants is detected. The light source may be single wavelength or it may have a plurality of wavelengths, or it may be a continuous spectrum from a broadband light source such as a Xenon arc. The detection of the light by also be single wavelength, or it may operate over several or many wavelengths such as by a spectrograph.

The desired outcome of completely etching through the wafer 406 and the optional DAF layer 422, without substantially compromising the support layer 420 in its purpose to support the wafer 406 before and after etch singulation, and to allow picking of the devices with optional DAF 422 without damaging the devices, may be accomplished by a least one of the following: (1) Timing the etch such that the wafer 406 and optional DAF 422 is completely singulated yet the etch does not progress too deeply into the optional adhesive layer 424 such that there is any risk that the support layer 420 could be structurally compromised. (2) Timing the etch such that the wafer 406 and optional DAF 422 is completely singulated yet the etch does not progress too deeply into the optional etch stop layer 426 such that there is any risk that the support layer 420 could be structurally compromised. (3) Timing the etch such that the wafer 406 and optional DAF 422 is completely singulated yet the etch does not progress too deeply into the support layer 420 such that the support layer 420 could be structurally compromised. (4) Selecting an adhesive with sufficiently low etch rate such that the wafer and optional DAF 422 is completely singulated yet the etch does not progress too deeply into the optional adhesive layer 424 such that there is any risk that the support layer 420 could be structurally compromised. (5) Selecting an etch stop layer 426 with sufficiently low etch rate such that the wafer 406 and optional DAF 422 is completely singulated yet the etch does not progress too deeply into the etch stop layer 426 such that there is any risk that the support layer 420 could be structurally compromised. (6) Selecting a support layer 420 with sufficiently low etch rate such that the wafer 406 and optional DAF 422 is completely singulated yet the etch does not progress too deeply into the support layer 420 such that the support layer 420 could be structurally compromised. (7) Selecting an adhesive sufficiently thick enough such that the wafer 406 and optional DAF 422 is completely singulated yet the etch does not progress too deeply into the optional adhesive layer 424 such that there is any risk that the support layer 420 could be structurally compromised. (8) Selecting an etch stop layer 426 sufficiently thick enough such that the wafer 406 and optional DAF 422 is completely singulated yet the etch does not progress too deeply into the etch stop layer 426 such that there is any risk that the support layer 420 could be structurally compromised. (9) Selecting a support layer 420 sufficiently thick enough such that the wafer 406 and optional DAF 422 is completely singulated yet the etch does not progress too deeply into the support layer 420 such that the support layer 420 could be structurally compromised. (10) Selecting an adhesive with sufficiently differentiable end point signal, and supplying an appropriate end point detecting apparatus and control system to detect end point and stop the etch process, such that the wafer 406 and optional DAF 422 is completely singulated yet the etch does not progress too deeply into the optional adhesive layer 424 such that there is any risk that the support layer 420 could be structurally compromised. (11) Selecting an etch stop layer 426 with sufficiently differentiable end point signal, and supplying an appropriate end point detecting apparatus and control system to detect end point and stop the etch process, such that the wafer 406 and optional DAF 422 is completely singulated yet the etch does not progress too deeply into the etch stop layer 426 such that there is any risk that the support layer 420 could be structurally compromised. (12) Selecting a support layer 420 with sufficiently differentiable end point signal, and supplying an appropriate end point detecting apparatus and control system to detect end point and stop the etch process, such that the wafer 406 and optional DAF 422 is completely singulated yet the etch does not progress too deeply into the support layer 420 such that the support layer 420 could be structurally compromised.

In an aspect of the present invention, a substrate carrier is accommodated in an etch chamber during a singulation process. In an embodiment, the assembly including a wafer or substrate on the substrate carrier is subjected to a plasma etch reactor without affecting (e.g., etching) the film frame (e.g., tape ring 304) and the film (e.g., backing tape 302).

Figure 5:
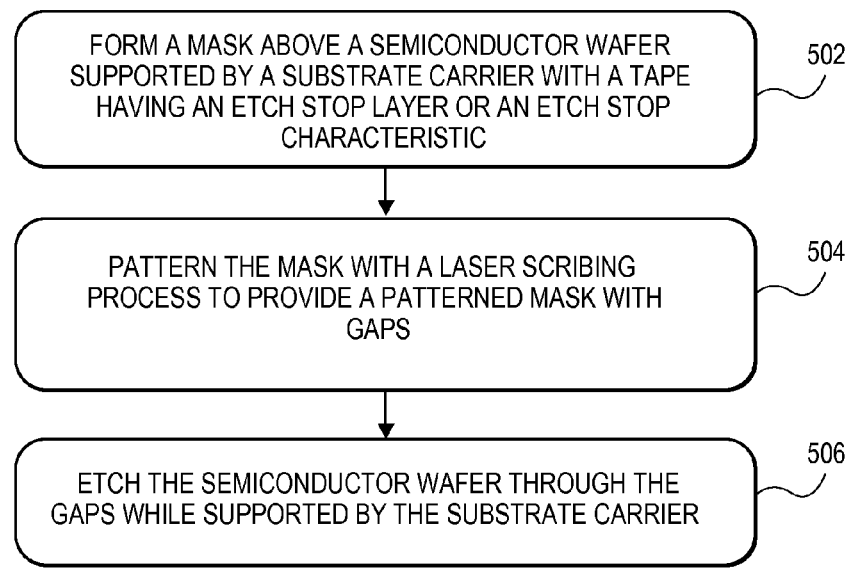
FIG. 5 is a Flowchart representing operations in a method of dicing a semiconductor wafer including a plurality of integrated circuits, in accordance with an embodiment of the present invention.
Figure 6A:
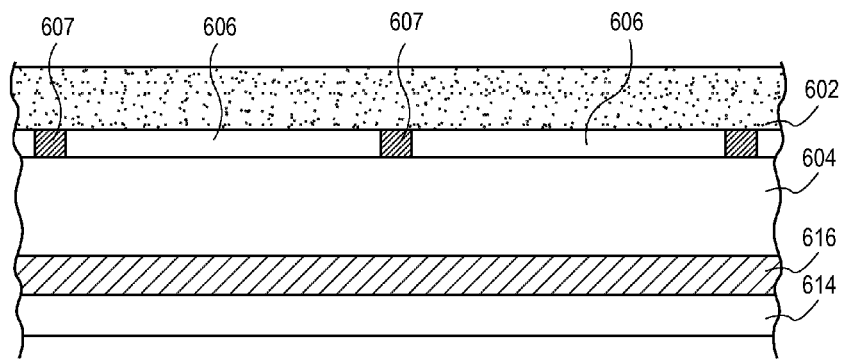
FIG. 6A illustrates a cross-sectional view of a semiconductor wafer including a plurality of integrated circuits during performing of a method of dicing the semiconductor wafer, corresponding to operation 502 of the Flowchart of FIG. 5, in accordance with an embodiment of the present invention.
Figure 6B:
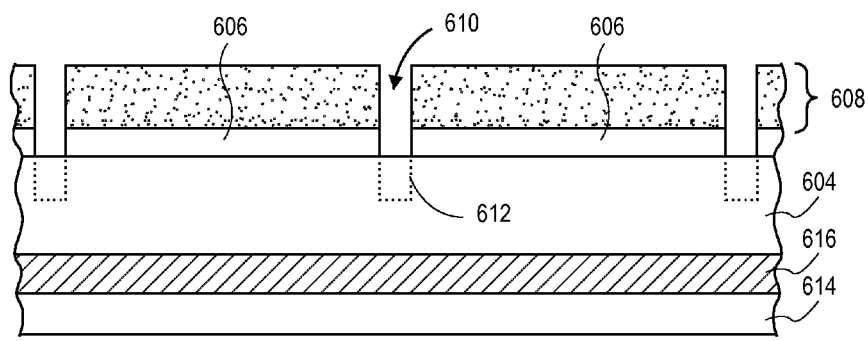
FIG. 6B illustrates a cross-sectional view of a semiconductor wafer including a plurality of integrated circuits during performing of a method of dicing the semiconductor wafer, corresponding to operation 504 of the Flowchart of FIG. 5, in accordance with an embodiment of the present invention.
Figure 6C:
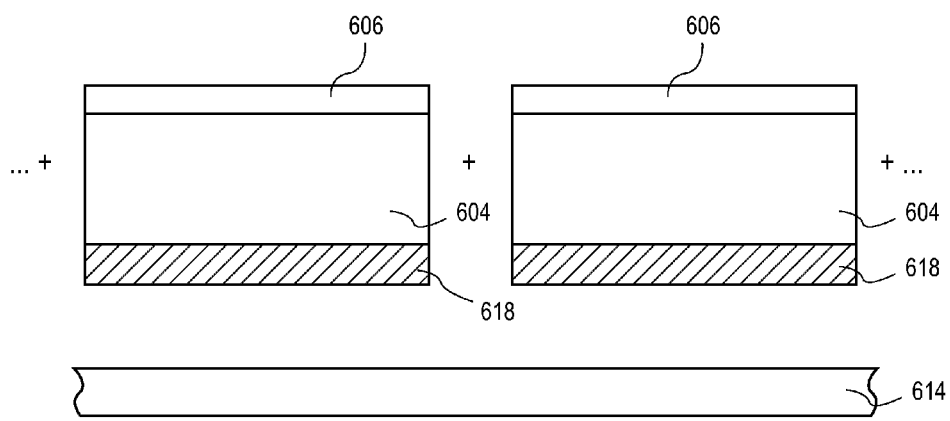
FIG. 6C illustrates a cross-sectional view of a semiconductor wafer including a plurality of integrated circuits during performing of a method of dicing the semiconductor wafer, corresponding to operation 506 of the Flowchart of FIG. 5, in accordance with an embodiment of the present invention.

In another aspect, FIG. 5 is a Flowchart 500 representing operations in a method of dicing a semiconductor wafer including a plurality of integrated circuits, in accordance with an embodiment of the present invention. FIGS. 6A-6C illustrate cross-sectional views of a semiconductor wafer including a plurality of integrated circuits during performing of a method of dicing the semiconductor wafer, corresponding to operations of Flowchart 500, in accordance with an embodiment of the present invention.

Referring to operation 502 of Flowchart 500, and corresponding FIG. 6A, a mask 602 is formed above a semiconductor wafer or substrate 604. The mask 602 is composed of a layer covering and protecting integrated circuits 606 formed on the surface of semiconductor wafer 604. The mask 602 also covers intervening streets 607 formed between each of the integrated circuits 606. The semiconductor wafer or substrate 604 is supported by a substrate carrier 614 (a tape portion of which is shown in FIG. 6A), such as described in association with FIG. 4. For example, in an embodiment, the substrate carrier 614 includes a tape that has an etch stop layer or has an etch stop characteristic, or both.

In an embodiment, the substrate carrier 614 includes a layer of backing tape, a portion of which is depicted as 614 in FIG. 6A, surrounded by a tape ring or frame (not shown). In one such embodiment, the semiconductor wafer or substrate 1204 is disposed on a die attach film 616 disposed on the substrate carrier 614, as is depicted in FIG. 6A.

In accordance with an embodiment of the present invention, forming the mask 602 includes forming a layer such as, but not limited to, a photo-resist layer or an I-line patterning layer. For example, a polymer layer such as a photo-resist layer may be composed of a material otherwise suitable for use in a lithographic process. In one embodiment, the photo-resist layer is composed of a positive photo-resist material such as, but not limited to, a 248 nanometer (nm) resist, a 193 nm resist, a 157 nm resist, an extreme ultra-violet (EUV) resist, or a phenolic resin matrix with a diazonaphthoquinone sensitizer. In another embodiment, the photo-resist layer is composed of a negative photo-resist material such as, but not limited to, poly-cis-isoprene and poly-vinyl-cinnamate.

In another embodiment, the mask 602 is a water-soluble mask layer. In an embodiment, the water-soluble mask layer is readily dissolvable in an aqueous media. For example, in one embodiment, the water-soluble mask layer is composed of a material that is soluble in one or more of an alkaline solution, an acidic solution, or in deionized water. In an embodiment, the water-soluble mask layer maintains its water solubility upon exposure to a heating process, such as heating approximately in the range of 50-160 degrees Celsius. For example, in one embodiment, the water-soluble mask layer is soluble in aqueous solutions following exposure to chamber conditions used in a laser and plasma etch singulation process. In one embodiment, the water-soluble mask layer is composed of a material such as, but not limited to, polyvinyl alcohol, polyacrylic acid, dextran, polymethacrylic acid, polyethylene imine, or polyethylene oxide. In a specific embodiment, the water-soluble mask layer has an etch rate in an aqueous solution approximately in the range of 1-15 microns per minute and, more particularly, approximately 1.3 microns per minute.

In another embodiment, the mask 602 is a UV-curable mask layer. In an embodiment, the mask layer has a susceptibility to UV light that reduces an adhesiveness of the UV-curable layer by at least approximately 80%. In one such embodiment, the UV layer is composed of polyvinyl chloride or an acrylic-based material. In an embodiment, the UV-curable layer is composed of a material or stack of materials with an adhesive property that weakens upon exposure to UV light. In an embodiment, the UV-curable adhesive film is sensitive to approximately 365 nm UV light. In one such embodiment, this sensitivity enables use of LED light to perform a cure.

In an embodiment, the semiconductor wafer or substrate 604 is composed of a material suitable to withstand a fabrication process and upon which semiconductor processing layers may suitably be disposed. For example, in one embodiment, semiconductor wafer or substrate 604 is composed of a group IV-based material such as, but not limited to, crystalline silicon, germanium or silicon/germanium. In a specific embodiment, providing semiconductor wafer 604 includes providing a monocrystalline silicon substrate. In a particular embodiment, the monocrystalline silicon substrate is doped with impurity atoms. In another embodiment, semiconductor wafer or substrate 604 is composed of a material such as, e.g., a material substrate used in the fabrication of light emitting diodes (LEDs).

In an embodiment, the semiconductor wafer or substrate 604 has a thickness of approximately 300 microns or less. For example, in one embodiment, a bulk single-crystalline silicon substrate is thinned from the backside prior to being affixed to the die attach film 616. The thinning may be performed by a backside grind process. In one embodiment, the bulk single-crystalline silicon substrate is thinned to a thickness approximately in the range of 50-300 microns. It is important to note that, in an embodiment, the thinning is performed prior to a laser ablation and plasma etch dicing process. In an embodiment, the die attach film 616 (or any suitable substitute capable of bonding a thinned or thin wafer or substrate to the substrate carrier 614) has a thickness of approximately 20 microns.

In an embodiment, the semiconductor wafer or substrate 604 has disposed thereon or therein, as a portion of the integrated circuits 606, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 606. Materials making up the streets 607 may be similar to or the same as those materials used to form the integrated circuits 606. For example, streets 607 may be composed of layers of dielectric materials, semiconductor materials, and metallization. In one embodiment, one or more of the streets 607 includes test devices similar to the actual devices of the integrated circuits 606.

Referring to operation 504 of Flowchart 500, and corresponding FIG. 6B, the mask 602 is patterned with a laser scribing process to provide a patterned mask 608 with gaps 610, exposing regions of the semiconductor wafer or substrate 604 between the integrated circuits 606. In one such embodiment, the laser scribing process is a femtosecond-based laser scribing process. The laser scribing process is used to remove the material of the streets 607 originally formed between the integrated circuits 606. In accordance with an embodiment of the present invention, patterning the mask 602 with the laser scribing process includes forming trenches 612 partially into the regions of the semiconductor wafer 604 between the integrated circuits 606, as is depicted in FIG. 6B.

In an embodiment, patterning the mask 602 with the laser scribing process includes using a laser having a pulse width in the femtosecond range. Specifically, a laser with a wavelength in the visible spectrum plus the ultra-violet (UV) and infra-red (IR) ranges (totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask 602, the streets 607 and, possibly, a portion of the semiconductor wafer or substrate 604.

Figure 7:
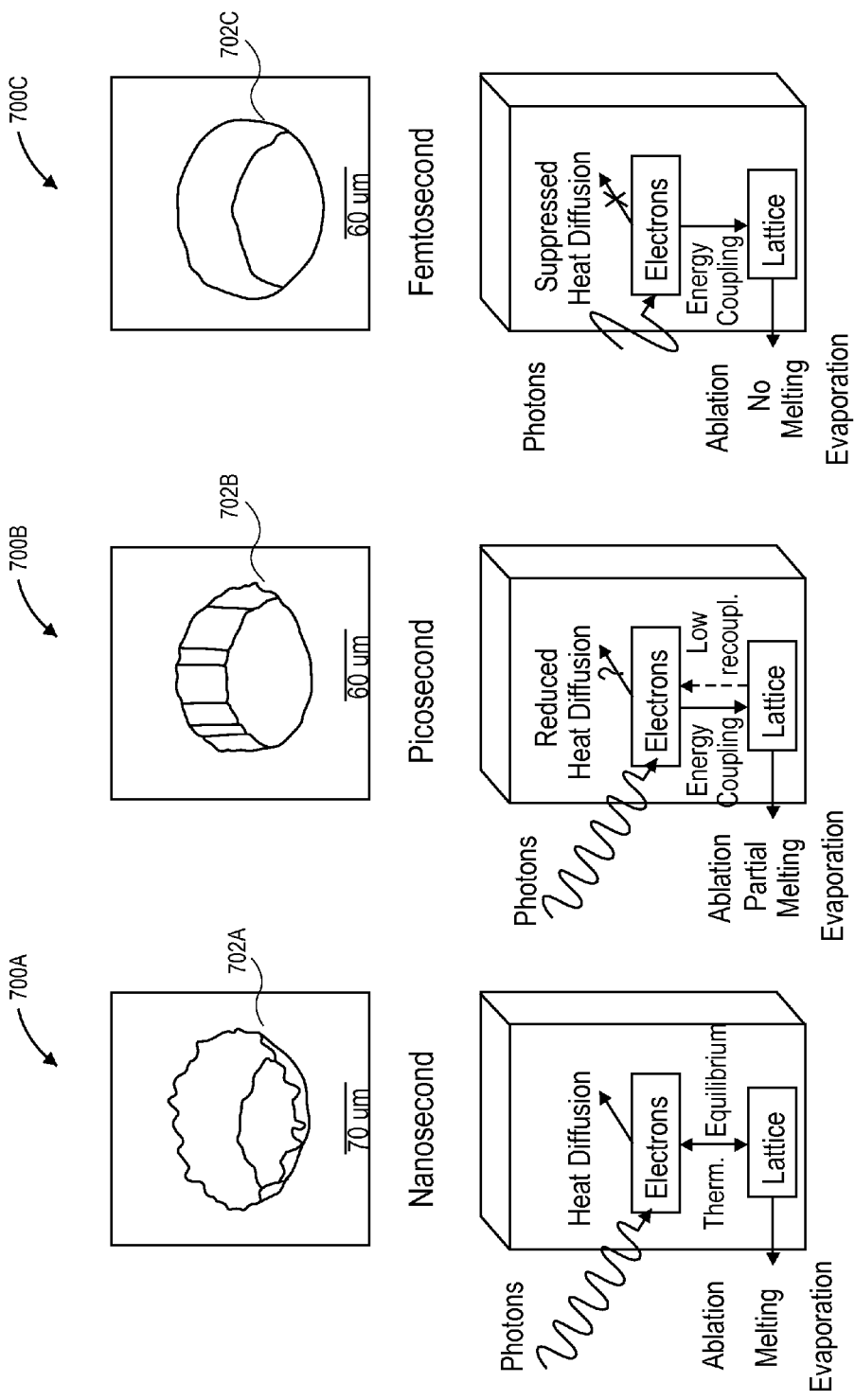
FIG. 7 illustrates the effects of using a laser pulse in the femtosecond range versus longer pulse times, in accordance with an embodiment of the present invention.

FIG. 7 illustrates the effects of using a laser pulse in the femtosecond range versus longer frequencies, in accordance with an embodiment of the present invention. Referring to FIG. 7, by using a laser with a pulse width in the femtosecond range heat damage issues are mitigated or eliminated (e.g., minimal to no damage 702C with femtosecond processing of a via 700C) versus longer pulse widths (e.g., damage 702B with picosecond processing of a via 700B and significant damage 702A with nanosecond processing of a via 700A). The elimination or mitigation of damage during formation of via 700C may be due to a lack of low energy recoupling (as is seen for picosecond-based laser ablation) or thermal equilibrium (as is seen for nanosecond-based laser ablation), as depicted in FIG. 7.

Laser parameters selection, such as pulse width, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

By contrast, if non-optimal laser parameters are selected, in a stacked structure that involves, e.g., two or more of an inorganic dielectric, an organic dielectric, a semiconductor, or a metal, a laser ablation process may cause delamination issues. For example, a laser penetrate through high bandgap energy dielectrics (such as silicon dioxide with an approximately of 9 eV bandgap) without measurable absorption. However, the laser energy may be absorbed in an underlying metal or silicon layer, causing significant vaporization of the metal or silicon layers. The vaporization may generate high pressures to lift-off the overlying silicon dioxide dielectric layer and potentially causing severe interlayer delamination and microcracking. In an embodiment, while picoseconds-based laser irradiation processes lead to microcracking and delaminating in complex stacks, femtosecond-based laser irradiation processes have been demonstrated to not lead to microcracking or delamination of the same material stacks.

In order to be able to directly ablate dielectric layers, ionization of the dielectric materials may need to occur such that they behave similar to a conductive material by strongly absorbing photons. The absorption may block a majority of the laser energy from penetrating through to underlying silicon or metal layers before ultimate ablation of the dielectric layer. In an embodiment, ionization of inorganic dielectrics is feasible when the laser intensity is sufficiently high to initiate photon-ionization and impact ionization in the inorganic dielectric materials.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spacial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Referring to operation 506 of Flowchart 500, and corresponding FIG. 6C, the semiconductor wafer or substrate 604 is etched through the gaps 610 in the patterned mask 608 to singulate the integrated circuits 606. In accordance with an embodiment of the present invention, etching the semiconductor wafer 604 includes etching to extend the trenches 612 formed with the laser scribing process and to ultimately etch entirely through semiconductor wafer or substrate 604, as depicted in FIG. 6C.

In an embodiment, etching the semiconductor wafer or substrate 604 includes using a plasma etching process. In one embodiment, a through-silicon via type etch process is used. For example, in a specific embodiment, the etch rate of the material of semiconductor wafer or substrate 604 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. The combination enables effective decoupling of the ion density from ion energy, so as to achieve relatively high density plasmas without the high, potentially damaging, DC bias levels, even at very low pressures. An exceptionally wide process window results. However, any plasma etch chamber capable of etching silicon may be used. In an exemplary embodiment, a deep silicon etch is used to etch a single crystalline silicon substrate or wafer 604 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which generally a fluorine-based gas such as $SF_6$, $C_4F_8$, $CHF_3$, $XeF_2$, or any other reactant gas capable of etching silicon at a relatively fast etch rate. In one embodiment, however, a Bosch process is used which involves formation of a scalloped profile.

In an embodiment, singulation may further include patterning of die attach film 616. In one embodiment, die attach film 616 is patterned by a technique such as, but not limited to, laser ablation, dry (plasma) etching or wet etching. In an embodiment, the die attach film 616 is patterned in sequence following the laser scribe and plasma etch portions of the singulation process to provide die attach film portions 618, as depicted in FIG. 6C. In an embodiment, the patterned mask 608 is removed after the laser scribe and plasma etch portions of the singulation process, as is also depicted in FIG. 6C. The patterned mask 608 may be removed prior to, during, or following patterning of the die attach film 616. In an embodiment, the semiconductor wafer or substrate 604 is etched while supported by the substrate carrier 614. In an embodiment, the die attach film 616 is also patterned while disposed on the substrate carrier 614.

Accordingly, referring again to Flowchart 500 and FIGS. 6A-6C, wafer dicing may be preformed by initial laser ablation through a mask, through wafer streets (including metallization), and partially into a silicon substrate. The laser pulse width may be selected in the femtosecond range. Die singulation may then be completed by subsequent through-silicon deep plasma etching. Additionally, removal of exposed portions of the die attach film is performed to provide singulated integrated circuits, each having a portion of a die attach film thereon. The individual integrated circuits, including die attach film portions may then be removed from the substrate carrier 614, as depicted in FIG. 6C. In an embodiment, the singulated integrated circuits are removed from the substrate carrier 614 for packaging. In one such embodiment, the patterned die attach film 618 is retained on the backside of each integrated circuit and included in the final packaging. However, in another embodiment, the patterned die attach film 614 is removed during or subsequent to the singulation process.

A single process tool may be configured to perform many or all of the operations in a hybrid laser ablation and plasma etch singulation process. For example, FIG. 8 illustrates a block diagram of a tool layout for laser and plasma dicing of wafers or substrates, in accordance with an embodiment of the present invention.

Figure 8:
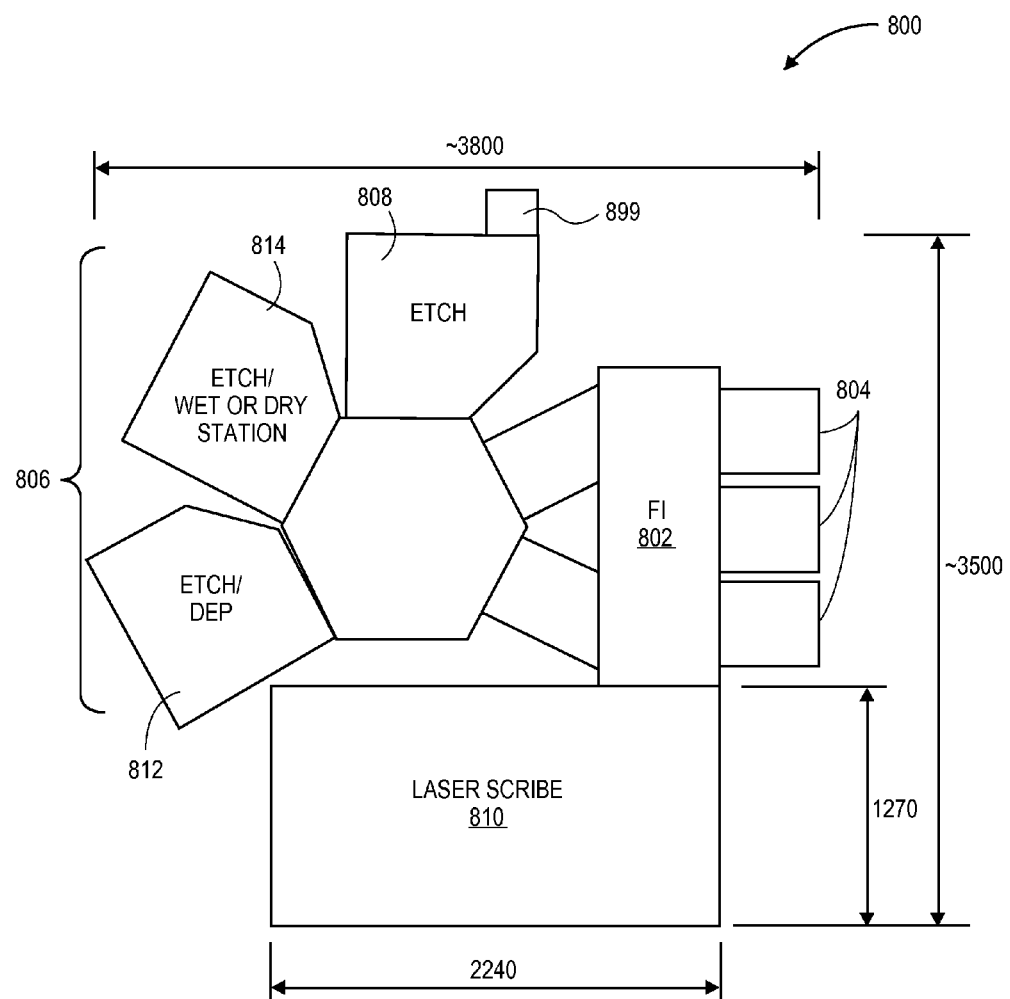
FIG. 8 illustrates a block diagram of a tool layout for laser and plasma dicing of wafers or substrates, in accordance with an embodiment of the present invention.

Referring to FIG. 8, a process tool 800 includes a factory interface 802 (FI) having a plurality of load locks 804 coupled therewith. A cluster tool 806 is coupled with the factory interface 802. The cluster tool 806 includes one or more plasma etch chambers, such as plasma etch chamber 808. A laser scribe apparatus 810 is also coupled to the factory interface 802. The overall footprint of the process tool 800 may be, in one embodiment, approximately 3500 millimeters (3.5 meters) by approximately 3800 millimeters (3.8 meters), as depicted in FIG. 8.

In an embodiment, the laser scribe apparatus 810 houses a femtosecond-based laser. The femtosecond-based laser may be suitable for performing a laser ablation portion of a hybrid laser and etch singulation process, such as the laser abalation processes described above. In one embodiment, a moveable stage is also included in laser scribe apparatus 810, the moveable stage configured for moving a wafer or substrate (or a carrier thereof) relative to the femtosecond-based laser. In a specific embodiment, the femtosecond-based laser is also moveable. The overall footprint of the laser scribe apparatus 810 may be, in one embodiment, approximately 2240 millimeters by approximately 1270 millimeters, as depicted in FIG. 8.

In an embodiment, the one or more plasma etch chambers 808 is configured for etching a wafer or substrate through the gaps in a patterned mask to singulate a plurality of integrated circuits. In one such embodiment, the one or more plasma etch chambers 808 is configured to perform a deep silicon etch process. In a specific embodiment, the one or more plasma etch chambers 808 is an Applied Centura® Silvia™ Etch system, available from Applied Materials of Sunnyvale, Calif., USA. The etch chamber may be specifically designed for a deep silicon etch used to create singulate integrated circuits housed on or in single crystalline silicon substrates or wafers. In an embodiment, a high-density plasma source is included in the plasma etch chamber 808 to facilitate high silicon etch rates. In an embodiment, more than one etch chamber is included in the cluster tool 806 portion of process tool 800 to enable high manufacturing throughput of the singulation or dicing process. In accordance with an embodiment of the present invention, one or more of the etch chambers 808 is equipped with an en end-point detection system 899. For example, in one embodiment, the end-point detection system 899 is used for detecting a change in etch conditions during etching on a substrate carrier, as described in association with FIG. 4.

The factory interface 802 may be a suitable atmospheric port to interface between an outside manufacturing facility with laser scribe apparatus 810 and cluster tool 806. The factory interface 802 may include robots with arms or blades for transferring wafers (or carriers thereof) from storage units (such as front opening unified pods) into either cluster tool 806 or laser scribe apparatus 810, or both.

Cluster tool 806 may include other chambers suitable for performing functions in a method of singulation. For example, in one embodiment, in place of an additional etch chamber, a deposition chamber 812 is included. The deposition chamber 812 may be configured for mask deposition on or above a device layer of a wafer or substrate prior to laser scribing of the wafer or substrate. In one such embodiment, the deposition chamber 812 is suitable for depositing a water soluble mask layer. In another embodiment, in place of an additional etch chamber, a wet/dry station 814 is included. The wet/dry station may be suitable for cleaning residues and fragments, or for removing a water soluble mask, subsequent to a laser scribe and plasma etch singulation process of a substrate or wafer. In an embodiment, a metrology station is also included as a component of process tool 800.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 800 described in association with FIG. 8, e.g., coupled with the end-point detection system 899 of the etch chamber 808. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 9:
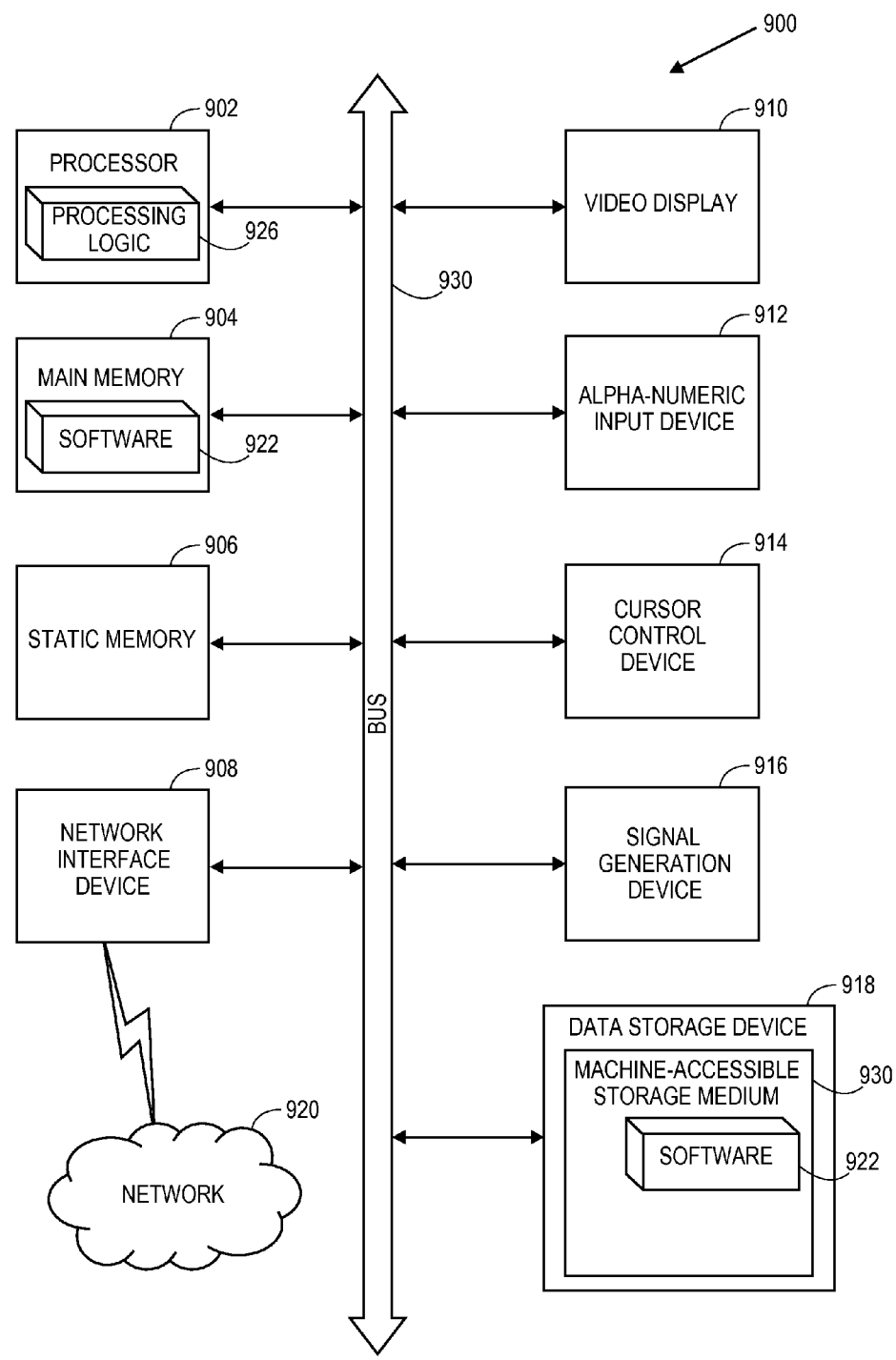
FIG. 9 illustrates a block diagram of an exemplary computer system, in accordance with an embodiment of the present invention.

FIG. 9 illustrates a diagrammatic representation of a machine in the exemplary form of a computer system 900 within which a set of instructions, for causing the machine to perform any one or more of the methodologies described herein (such as end-point detection), may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 900 includes a processor 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a secondary memory 918 (e.g., a data storage device), which communicate with each other via a bus 930.

Processor 902 represents one or more general-purpose processing devices such as a microprocessor, central processing unit, or the like. More particularly, the processor 902 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 902 may also be one or more special-purpose processing devices such as an application specific integrated circuit (ASIC), a field programmable gate array (FPGA), a digital signal processor (DSP), network processor, or the like. Processor 902 is configured to execute the processing logic 926 for performing the operations described herein.

The computer system 900 may further include a network interface device 908. The computer system 900 also may include a video display unit 910 (e.g., a liquid crystal display (LCD), a light emitting diode display (LED), or a cathode ray tube (CRT)), an alphanumeric input device 912 (e.g., a keyboard), a cursor control device 914 (e.g., a mouse), and a signal generation device 916 (e.g., a speaker).

The secondary memory 918 may include a machine-accessible storage medium (or more specifically a computer-readable storage medium) 932 on which is stored one or more sets of instructions (e.g., software 922) embodying any one or more of the methodologies or functions described herein. The software 922 may also reside, completely or at least partially, within the main memory 904 and/or within the processor 902 during execution thereof by the computer system 900, the main memory 904 and the processor 902 also constituting machine-readable storage media. The software 922 may further be transmitted or received over a network 920 via the network interface device 908.

While the machine-accessible storage medium 932 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of dicing a semiconductor wafer having a plurality of integrated circuits.

Thus, methods of and carriers for dicing semiconductor wafers, each wafer having a plurality of integrated circuits, have been disclosed.

What is claimed is:

1. A method of dicing a wafer or substrate supported by a carrier, the method comprising:

etching the wafer or substrate by a plasma process, wherein the carrier comprises a frame having a perimeter surrounding an inner opening, and a tape coupled to the frame and disposed below the inner opening of the frame, and wherein the tape comprises an etch stop layer disposed above a support layer, the etch stop layer comprising a layer of silicon dioxide; and detecting a change in etch by-products upon etching through the wafer or substrate and exposing of the carrier, wherein detecting the change in etch by-products upon etching through the wafer or substrate and exposing of the carrier comprises detecting the change upon exposing of the etch stop layer.

2. The method of claim 1, wherein the detecting is performed by using an optical emission sensor (OES) end point detection system or a laser end point system.

3. The method of claim 1, further comprising:
   terminating the etching upon detecting the change in etch by-products.

4. The method of claim 1, wherein etching the wafer or substrate by the plasma process singulates the wafer or substrate into individual dies or integrated circuits.

5. The method of claim 1, further comprising:
   prior to etching the wafer or substrate by the plasma process, forming an etch mask on the wafer or substrate.

6. The method of claim 5, further comprising:
   subsequent to forming the etch mask and prior to etching the wafer or substrate, laser scribing the etch mask to expose dicing streets of the wafer or substrate.

7. The method of claim 5, further comprising:
   subsequent to etching the wafer or substrate, removing the etch mask.

8. The method of claim 1, wherein the tape further comprises an adhesive layer disposed above the etch stop layer.

9. The method of claim 1, wherein the tape further comprises a die-attach-film (DAF) disposed above the etch stop layer.

* * * * *